United States Patent
Jin et al.

(10) Patent No.: US 10,148,233 B2
(45) Date of Patent: *Dec. 4, 2018

(54) TRANSMIT-RECEIVE ISOLATION IN A TRANSFORMER-BASED RADIO FREQUENCY POWER AMPLIFIER

(71) Applicant: Skyworks Solutions, Inc., Woburn, MA (US)

(72) Inventors: Yalin Jin, San Jose, CA (US); Setu Mohta, Pasadena, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/983,256

(22) Filed: Dec. 29, 2015

(65) Prior Publication Data

US 2016/0226552 A1    Aug. 4, 2016

Related U.S. Application Data

(60) Provisional application No. 62/098,088, filed on Dec. 30, 2014.

(51) Int. Cl.
*H03F 1/56* (2006.01)
*H04B 1/44* (2006.01)
(Continued)

(52) U.S. Cl.
CPC ........... *H03F 1/565* (2013.01); *H03F 1/0222* (2013.01); *H03F 1/0227* (2013.01); *H03F 3/195* (2013.01); *H03F 3/211* (2013.01); *H03F 3/213* (2013.01); *H03F 3/24* (2013.01); *H03F 3/245* (2013.01); *H03F 3/601* (2013.01); *H03F 3/605* (2013.01); *H04B 1/04* (2013.01); *H04B 1/123* (2013.01);
(Continued)

(58) Field of Classification Search
CPC ...... H03F 1/0222; H03F 1/0227; H03F 1/565; H03F 3/195; H03F 3/211; H03F 3/213; H03F 3/245; H03F 3/601; H03F 3/605; H03F 2200/102; H03F 2200/105; H03F 2200/165; H03F 2200/294; H03F 2200/37; H04B 1/04; H04B 1/123; H04B 1/525; H01L 24/00; H01L 24/01
See application file for complete search history.

(56) References Cited

U.S. PATENT DOCUMENTS 6,501,363 B1 * 12/2002 Hwu .................. H01F 27/2804
29/602.1
6,737,948 B2    5/2004 Aoki et al.
(Continued)

FOREIGN PATENT DOCUMENTS

EP    2204906 A1    7/2010

OTHER PUBLICATIONS

Search Report dated Nov. 4, 2016 for International Application No. PCT/US2015/067929 in 15 pages.

*Primary Examiner* — Devan Sandiford
(74) *Attorney, Agent, or Firm* — Knobbe, Martens, Olson & Bear, LLP

(57) ABSTRACT

Embodiments of radio frequency (RF) systems include a transmit/receive switch integrated with one or more power amplifiers and/or other components. The power amplifiers can have transformer-based architectures. A compensation circuit can act to protect the receive path during an RF transmit mode.

18 Claims, 9 Drawing Sheets

(51) Int. Cl.
  *H03F 1/02* (2006.01)
  *H03F 3/195* (2006.01)
  *H03F 3/21* (2006.01)
  *H03F 3/213* (2006.01)
  *H03F 3/24* (2006.01)
  *H03F 3/60* (2006.01)
  *H04B 1/12* (2006.01)
  *H04B 1/525* (2015.01)
  *H04B 1/04* (2006.01)

(52) U.S. Cl.
  CPC ............... *H04B 1/44* (2013.01); *H04B 1/525* (2013.01); *H03F 2200/102* (2013.01); *H03F 2200/105* (2013.01); *H03F 2200/165* (2013.01); *H03F 2200/294* (2013.01); *H03F 2200/375* (2013.01); *H03F 2200/387* (2013.01); *H03F 2200/417* (2013.01); *H03F 2200/423* (2013.01); *H03F 2200/451* (2013.01); *H03F 2200/537* (2013.01); *H03F 2200/541* (2013.01); *H04B 2001/0408* (2013.01)

(56) References Cited

U.S. PATENT DOCUMENTS

| | | |
|---|---|---|
| 6,816,012 B2 | 11/2004 | Aoki et al. |
| 6,856,199 B2 | 2/2005 | Komijani et al. |
| 7,075,371 B2 | 7/2006 | Aoki et al. |
| 7,095,283 B2 | 8/2006 | Kee et al. |
| 7,119,619 B2 | 10/2006 | Komijani et al. |
| 7,157,975 B2 | 1/2007 | Hajimiri et al. |
| 7,256,573 B2 | 8/2007 | Magoon et al. |
| 7,269,391 B2 | 9/2007 | Chiu |
| 7,330,076 B2 | 2/2008 | Komijani et al. |
| 7,342,457 B2 | 3/2008 | Hajimiri et al. |
| 7,425,869 B2 | 9/2008 | Aoki et al. |
| 7,471,153 B2 | 12/2008 | Kee et al. |
| 7,486,137 B2 | 2/2009 | Magoon et al. |
| 7,646,249 B2 | 1/2010 | Hajimiri et al. |
| 7,733,183 B2 | 6/2010 | Komijani et al. |
| 7,760,025 B2 | 7/2010 | Kee et al. |
| 7,915,960 B2 | 3/2011 | Kee et al. |
| 7,920,833 B2 | 4/2011 | Qiao et al. |
| 7,999,621 B2 | 8/2011 | Hajimiri et al. |
| 8,018,283 B2 | 9/2011 | Komijani et al. |
| 8,019,292 B2 | 9/2011 | Magoon et al. |
| 8,049,563 B2 | 11/2011 | Aoki et al. |
| 8,242,855 B2 | 8/2012 | Kee et al. |
| 8,285,239 B2 | 10/2012 | Molnar et al. |
| 8,350,625 B2 | 1/2013 | Komijani et al. |
| 8,577,312 B2 | 11/2013 | Magoon et al. |
| 9,031,517 B2* | 5/2015 | Jerng .................. H04B 1/0458 330/252 |
| 9,219,518 B1* | 12/2015 | Chen ...................... H04B 1/401 |
| RE45,974 E | 4/2016 | Kee et al. |
| 9,484,977 B2* | 11/2016 | Anderson ............... H04B 1/48 |
| 9,882,601 B1 | 1/2018 | Feldman |
| 2002/0135422 A1 | 9/2002 | Aoki et al. |
| 2003/0169105 A1 | 9/2003 | Hajimiri et al. |
| 2003/0169113 A1 | 9/2003 | Komijani et al. |
| 2003/0179836 A1 | 9/2003 | Masenten |
| 2003/0184369 A1 | 10/2003 | Aoki et al. |
| 2005/0030098 A1 | 2/2005 | Aoki et al. |
| 2005/0140447 A1 | 6/2005 | Komijani et al. |
| 2005/0184813 A1 | 8/2005 | Kee et al. |
| 2005/0189995 A1 | 9/2005 | Kee et al. |
| 2005/0200420 A1 | 9/2005 | Kee et al. |
| 2005/0255812 A1* | 11/2005 | Na ........................... H04B 1/48 455/78 |
| 2005/0275454 A1 | 12/2005 | Hajimiri et al. |
| 2006/0017538 A1 | 1/2006 | Magoon et al. |
| 2006/0170503 A1 | 8/2006 | Lee et al. |
| 2006/0223456 A1 | 10/2006 | Ouzillou |
| 2006/0250187 A1 | 11/2006 | Aoki et al. |
| 2007/0024382 A1 | 2/2007 | Zachan et al. |
| 2007/0030071 A1 | 2/2007 | Komijani et al. |
| 2007/0096828 A1 | 5/2007 | Hajimiri et al. |
| 2007/0298732 A1 | 12/2007 | Lee |
| 2008/0061875 A1 | 3/2008 | Magoon et al. |
| 2008/0117894 A1* | 5/2008 | McMorrow ............. H03F 3/217 370/359 |
| 2008/0204139 A1 | 8/2008 | Komijani et al. |
| 2008/0211584 A1 | 9/2008 | Hajimiri et al. |
| 2008/0231535 A1* | 9/2008 | Rofougaran ............ H03F 3/211 343/850 |
| 2009/0002071 A1* | 1/2009 | Aoki ....................... H03F 1/223 330/269 |
| 2009/0015324 A1 | 1/2009 | Magoon et al. |
| 2009/0017775 A1* | 1/2009 | Qiao ........................ H04B 1/44 455/78 |
| 2009/0073078 A1* | 3/2009 | Ahn ..................... H03K 17/063 343/876 |
| 2009/0102592 A1 | 4/2009 | Kee et al. |
| 2010/0117733 A1 | 5/2010 | Hajimiri et al. |
| 2010/0203844 A1* | 8/2010 | Gorbachov ............. H04B 1/18 455/83 |
| 2010/0244955 A1 | 9/2010 | Komijani et al. |
| 2010/0283548 A1 | 11/2010 | Kee et al. |
| 2011/0003563 A1* | 1/2011 | Gorbachov ........ H01Q 21/0025 455/78 |
| 2011/0068636 A1* | 3/2011 | Lee ...................... H03K 17/693 307/115 |
| 2011/0175685 A1 | 7/2011 | Kee et al. |
| 2012/0025914 A1 | 2/2012 | Kim et al. |
| 2012/0176200 A1 | 7/2012 | Hajimiri et al. |
| 2012/0286878 A1* | 11/2012 | Dening .................. H01L 23/66 330/296 |
| 2013/0078931 A1 | 3/2013 | Jerng |
| 2013/0257545 A1* | 10/2013 | Jeon ....................... H03F 1/223 330/310 |
| 2013/0267185 A1 | 10/2013 | Chen |
| 2014/0084700 A1 | 3/2014 | Anderson |
| 2014/0199951 A1 | 7/2014 | Yu |
| 2015/0094117 A1 | 4/2015 | Conta |
| 2015/0236691 A1 | 8/2015 | Cam |
| 2015/0333791 A1* | 11/2015 | Anderson ................ H04B 1/44 455/83 |
| 2016/0226552 A1 | 8/2016 | Jin |
| 2016/0226553 A1 | 8/2016 | Jin |
| 2016/0227603 A1 | 8/2016 | Huang |
| 2016/0248469 A1* | 8/2016 | Jin ....................... H03F 1/0227 |
| 2016/0276097 A1 | 9/2016 | Lewis |
| 2017/0070199 A1* | 3/2017 | Anderson ............... B82Y 10/00 |
| 2017/0077877 A1* | 3/2017 | Anderson ............... B82Y 10/00 |
| 2017/0163215 A1 | 6/2017 | Gorbachov |
| 2017/0250728 A1 | 8/2017 | Afsahi |
| 2018/0006618 A1 | 1/2018 | Mohta |
| 2018/0145647 A1 | 5/2018 | Matsuno |

\* cited by examiner

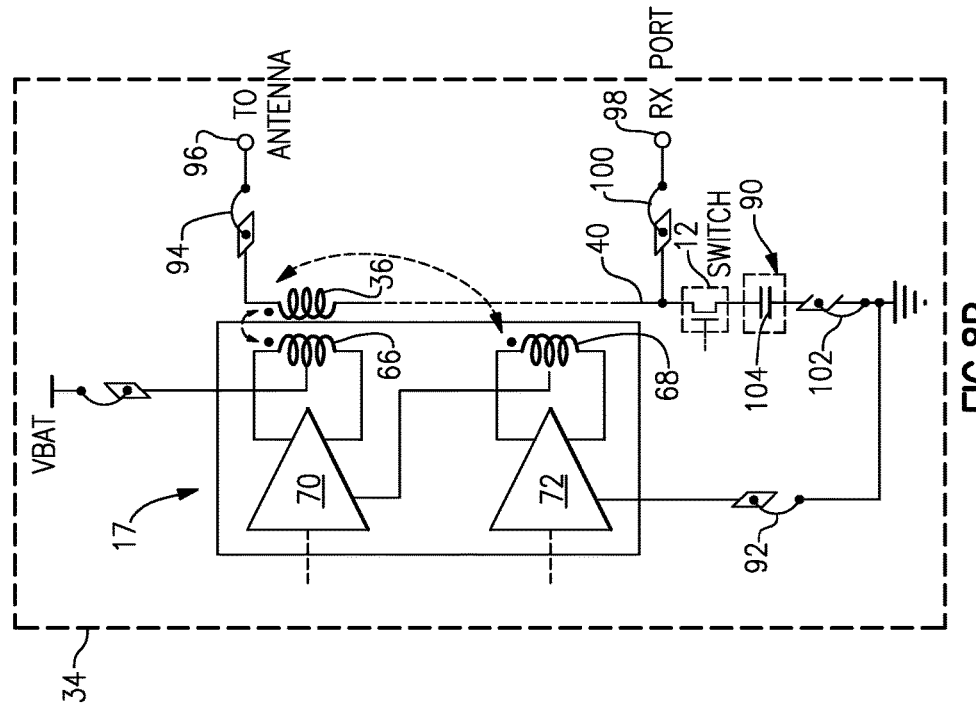
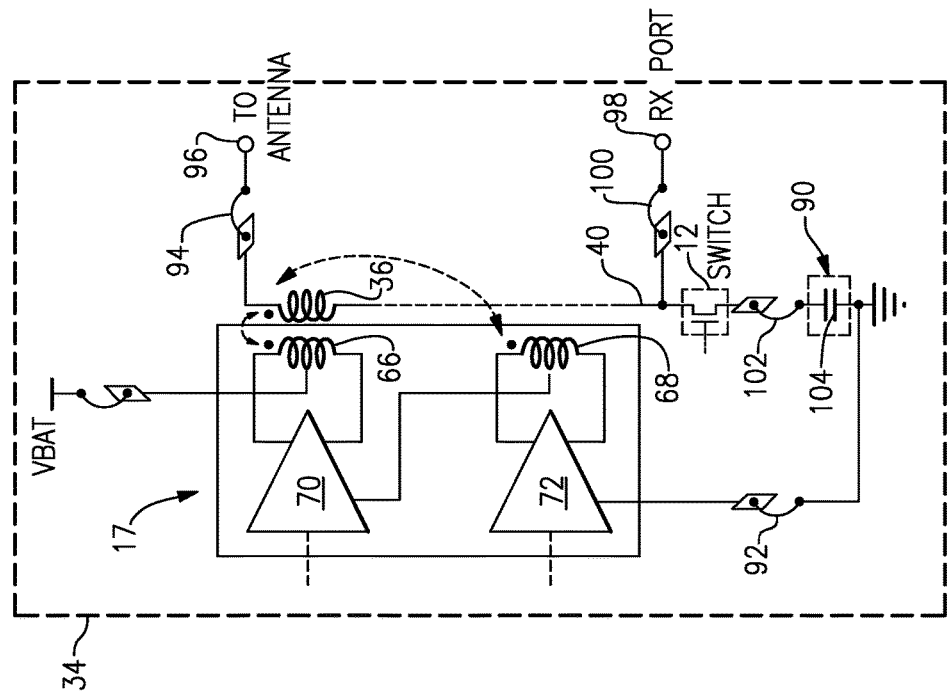
FIG. 8A
FIG. 8B

TRANSMIT-RECEIVE ISOLATION IN A TRANSFORMER-BASED RADIO FREQUENCY POWER AMPLIFIER

CROSS-REFERENCE TO RELATED APPLICATION

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronic systems, and in particular, to radio frequency (RF) systems providing a transmit/receive switch that is integrated with one or more power amplifiers and/or other components.

Description of the Related Technology

Power amplifiers can be included in mobile devices to amplify a radio frequency (RF) signal for transmission via an antenna. For example, in mobile devices having a time division multiple access (TDMA) architecture and frequency division multiple access (FDMA), such as those found in Global System for Mobile Communications (GSM), code division multiple access (CDMA), and wideband code division multiple access (W-CDMA) systems, a power amplifier can be used to provide amplification during an assigned transmit time slot. Additionally, in mobile devices using frequency division duplexing (FDD), such as systems using long term evolution (LTE), a power amplifier can be used to provide amplification to one or more transmit carrier frequencies.

In order to meet operating specifications, power amplifiers in mobile phones and other RF devices are typically designed to generate relatively large output signals and corresponding power levels. This has historically made it difficult to integrate power amplifiers with other components.

SUMMARY

According to certain aspects of the disclosure, a complementary metal oxide semiconductor (CMOS) die is provided comprising a power amplifier. The power amplifier includes a transformer having a primary winding and a secondary winding. The power amplifier can be configured in a transmit mode to amplify a radio frequency (RF) transmit signal received on the primary winding and to provide an amplified RF transmit signal on an antenna side of the secondary winding. The power amplifier can be further configured in a receive mode to transmit an RF receive signal from the antenna side of the secondary winding to a receive side of the secondary winding. The CMOS die can further include a transmit/receive switch between the receive side of the secondary winding and a bond pad of the die. The CMOS die can be formed using conventional bulk CMOS processing, for example (e.g., without using semiconductor-on-insulator [SOI] processing technology).

In a transmit mode the transmit/receive switch can be configured to be closed, creating a low impedance path from the receive side of the secondary winding to the bond pad. In a receive mode the transmit/receive switch can be configured to be open, creating a high impedance path from the receive side of the secondary winding to the bond pad.

The CMOS die can further comprise a receive port in electrical communication with the receive side of the secondary winding. The switch can include a first terminal in electrical communication with the receive side of the secondary winding, a second terminal in electrical communication with the bond pad, and a control input that receives a transmit/receive control signal. The transmit/receive switch can be a single transistor, for example.

The CMOS die can further comprise a compensation circuit disposed between the switch and the bond pad. The compensation circuit can be configured to improve isolation of the receive port from the RF transmit signal in the transmit mode. The compensation circuit can include a capacitor, for example. The compensation circuit can counteract a reactance of a bond wire positioned in a path between the bond pad and the switch.

A variety of implementations are possible. For instance, the bond pad can connect to a ground reference. Moreover, the power amplifier can include a plurality amplifier driver stages connected to the primary winding.

The primary winding in some implementations receives a set of bias signals having a first set of values in the transmit mode to bias the primary winding in a first state, and having a second set of values in a receive mode to bias the primary winding in a second state in which a difference between center frequencies of the primary winding and the secondary winding is greater than when the primary winding is biased in the first state.

The power amplifier can be a distributed active transformer-type power amplifier. A geometry of the secondary winding generally matches a geometry of the primary winding in some configurations. For instance, the primary winding in some implementations has an inner winding generally conforming to an interior boundary of the secondary winding and an outer winding generally conforming to an exterior boundary of the secondary winding.

According to additional aspects of the disclosure a wireless device is provided comprising a radio frequency (RF) antenna and a semiconductor die. The semiconductor die can have a power amplifier which includes a transformer having a primary winding and a secondary winding. The power amplifier can be configured in a transmit mode to amplify an RF transmit signal received on the primary winding and provide an amplified RF transmit signal on an antenna side of the secondary winding. The power amplifier can be further configured in a receive mode to transmit an RF receive signal from the antenna side of the secondary winding to a receive side of the secondary winding. The die can further include a transmit/receive switch between the receive side of the secondary winding and a bond pad of the die.

In a transmit mode the transmit/receive switch can be configured to close, creating a low impedance path from the receive side of the secondary winding to the bond pad, and in a receive mode the transmit/receive switch is configured to open, creating a high impedance path from the receive side of the secondary winding to the bond pad.

The semiconductor die is a complementary metal oxide semiconductor (CMOS) die in some implementations. For example, the CMOS die can be formed using conventional bulk CMOS processing (e.g., without using SOI processing technology).

According to yet additional aspects, a method of operating a radio frequency (RF) device is provided. The method can comprise, when the RF device is in an RF transmit mode: providing an RF transmit signal to a primary winding of a power amplifier included on a semiconductor die;

amplifying the RF transmit signal with the power amplifier to provide an amplified version of the RF transmit signal on an antenna side of a secondary winding of the power amplifier; and controlling a transmit/receive switch positioned on the die between a receive side of the secondary winding and a bond pad of the die to create a low impedance path from the antenna side of the secondary winding to the bond pad. For example, the die can be formed using conventional bulk CMOS processing (e.g., without using SOI processing technology).

The creation of the low impedance path can result in improved isolation of an RF receive port of the die from the RF transmit signal.

The method can further comprise, when the RF device is an RF receive mode: receiving an RF receive signal on the antenna side of the secondary winding; and controlling the transmit/receive switch to create a high impedance path between the receive side of the secondary winding and the bond pad.

According to further aspects of the disclosure, a radio frequency (RF) device is provided comprising an antenna and a receive path configured to process RF receive signals detected by the antenna. The RF device can further include a switch positioned between a node in the receive path and a reference voltage such that the switch creates a low impedance path between the node and the reference voltage when the switch is on in an RF transmit mode and creates a high impedance path to the reference voltage when the switch is off in an RF receive mode. The RF device can further include a compensation circuit connected in series with the switch in a path extending from the switch to the reference voltage. The compensation circuit can act to limit a voltage swing present at the node in the receive path when the switch is closed in the RF transmit mode.

The compensation circuit can include a capacitor, for example. The compensation circuit can counteracts a reactance of a bond wire residing in the path between the switch and the reference voltage.

The RF device can further comprise a power amplifier, where the switch, the compensation circuit, and the power amplifier are integrated together on a semiconductor die with the power amplifier. The compensation circuit can resides on the semiconductor die between a first terminal of the switch and a bond pad of the semiconductor die. The node in the receive path in some configurations is electrically coupled to a second terminal of the switch and to a receive port of the semiconductor die. In some implementations, the power amplifier outputs an amplified RF transmit signal for delivery to the antenna when the RF device is in the RF transmit mode. The compensation circuit can improve isolation between the receive path and the RF transmit signal when the RF device is in the RF transmit mode. The die can be formed using conventional bulk CMOS processing (e.g., without using SOI processing technology).

The power amplifier can be a distributed active transformer-based power amplifier including a primary winding and a secondary winding, such as where the secondary winding can generally match the geometry of the primary winding. The primary winding can have an inner winding generally conforming to an interior boundary of the secondary winding and an outer winding generally conforming to an exterior boundary of the secondary winding. The primary winding can receive a set of bias signals having a first set of values in the RF transmit mode to bias the primary winding in a first state and having a second set of values in the RF receive mode to bias the primary winding in a second state in which the primary and secondary windings are detuned with respect to one another.

According to certain aspects of the disclosure, a semiconductor die is provided comprising a power amplifier configured to output an RF transmit signal and a receive path configured to communicate and process an RF receive signal. The semiconductor die can also include a switch positioned between a node in the receive path and a pad of the semiconductor die. The switch can create a low impedance path between the node and the pad when the switch is on in an RF transmit mode and create a high impedance path to the pad when the switch is off in an RF receive mode. The semiconductor die can further include a compensation circuit connected in series with the switch in a path extending from the switch to the pad. The compensation circuit can act to limit a voltage swing present at the node in the receive path when the switch is closed in the RF transmit mode. The die can be formed using conventional bulk CMOS processing (e.g., without using SOI processing technology).

The power amplifier can be a distributed active transformer-based power amplifier including a primary winding and a secondary winding, such as where the geometry of the secondary winding generally matches the geometry of the primary winding. The primary winding can have an inner winding generally conforming to an interior boundary of the secondary winding and an outer winding generally conforming to an exterior boundary of the secondary winding.

The compensation circuit can include a capacitor in some configurations, such as where the compensation circuit counteracts a reactance of a bond wire residing in a path between the switch and the pad.

According to yet further aspects of the disclosure a method of operating a radio frequency (RF) device is provided, where the comprises, when the RF device is in an RF transmit mode: providing an RF transmit signal to a power amplifier of the RF device; amplifying the RF transmit signal with the power amplifier to provide an amplified version of the RF transmit signal; and controlling a transmit/receive switch to create a low impedance path from a node in a receive path of the RF device to a reference voltage. The method can further comprise, with a compensation circuit positioned between the switch and the reference voltage, limiting a voltage swing present at the node in the receive path due to leakage of the RF transmit signal.

The compensation circuit can include a capacitor, and can limits the voltage swing by counteracting a reactance of a wire in the path between the switch and the reference voltage.

A radiofrequency (RF) device is provided according to some aspects of the disclosure. The RF device can comprise a power amplifier having a primary winding and a secondary winding, where the power amplifier configured in a transmit mode to amplify an RF transmit signal received on the primary winding and provide an amplified RF transmit signal on the secondary winding. The RF device can further comprise a controller configured, when the RF device is in a transmit mode, to bias the primary winding in a first state and, when the RF device is in a receive mode, to bias the primary winding in a second state in which a difference between center frequencies of the primary winding and the secondary winding is significantly greater than when the primary winding is biased in the first state.

The RF device can further comprise a transmit/receive switch coupled to a receive side of the secondary winding. The power amplifier and the switch can reside together on a complementary metal oxide semiconductor (CMOS) die.

The switch can configured to close in a transmit mode thereby creating a low impedance path from a receive side of the secondary winding to a bond pad of the die, and further configured to open in a receive mode thereby creating a high impedance path from the receive side of the secondary winding to the bond pad. The CMOS die in some implementations further includes a receive port in electrical communication with the receive side of the secondary winding. The switch can include a first terminal in electrical communication with the receive side of the secondary winding, a second terminal in electrical communication with the bond pad, and a control input receiving a transmit/receive switching control signal. The switch can include a single transistor in some configurations. The CMOS die can be formed using conventional bulk CMOS processing (e.g., without using SOI processing technology).

The RF device can further comprising a compensation circuit disposed between the switch and the bond pad and configured to improve isolation of the receive port from the RF transmit signal in the transmit mode. The compensation circuit can include a capacitor for example, and can counteract a reactance of a bond wire positioned in a path between the bond pad and the switch.

The bond pad can be a ground bond pad in some cases. The power amplifier can include a plurality amplifier driver stages connected to the primary winding, such as where the controller biases the primary winding by applying bias voltage levels to transistors in the amplifier driver stages.

The power amplifier can be a distributed active transformer-type power amplifier, for example, such as where a geometry of the secondary winding generally matches the geometry of the primary winding. The primary winding can have an inner winding generally conforming to an interior boundary of the secondary winding and an outer winding generally conforming to an exterior boundary of the secondary winding.

According to additional aspects of the disclosure, a method is provided of operating a wireless device. The method can include, in response to the wireless device entering a receive mode, biasing a primary winding of a power amplifier of the wireless device in a first state. The method can further include, in response to the wireless device entering a transmit mode, biasing the primary winding in a second state resulting in a transfer of energy from the primary winding to the secondary winding being significantly less than when the primary winding is biased in the first state.

The biasing of the primary winding in the first state can include applying a first set of bias voltage levels to transistors in amplifier driver stages of the primary winding. The biasing of the primary winding in the second state can include applying a second set of bias voltage levels to the transistors in the amplifier driver stages of the primary winding.

BRIEF DESCRIPTION OF THE DRAWINGS

FIGS. 8A-8B are schematic diagrams showing examples of power amplifier configurations including a compensation circuit to improve isolation of the receive path from the transmit path during signal transmission.

DETAILED DESCRIPTION OF EMBODIMENTS

Figure 1:
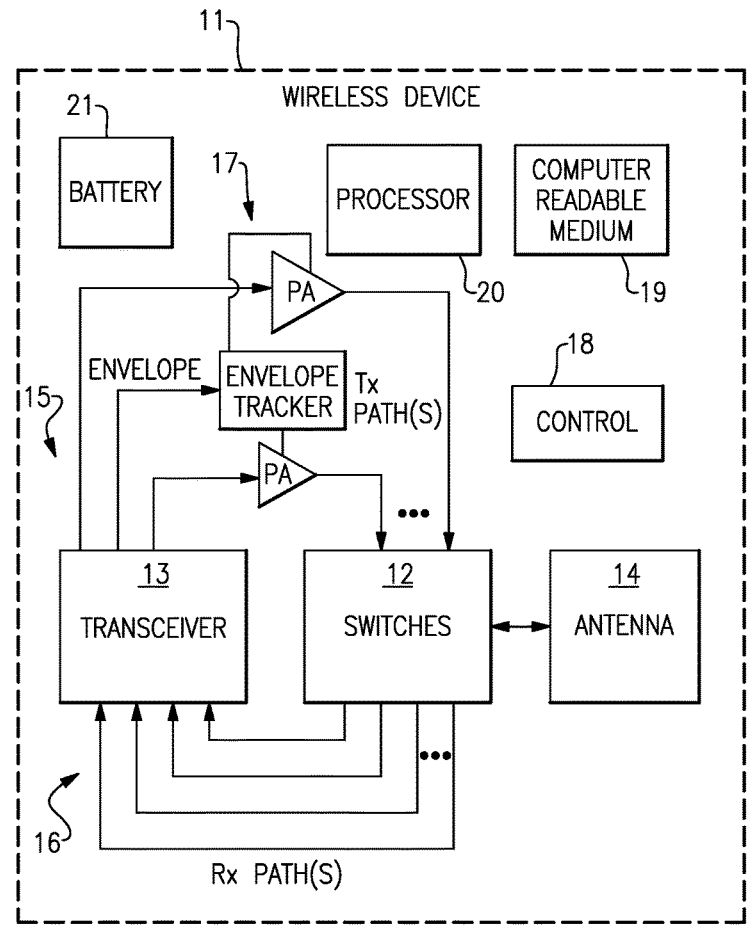
FIG. 1 is a schematic block diagram of an example of a wireless device.

The headings provided herein, if any, are for convenience only and do not necessarily affect the scope or meaning of the claimed invention.

There is a desire to reduce a power amplifier system cost by manufacturing power amplifier circuitry using complementary metal oxide semiconductor (CMOS) processing. For instance, conventional CMOS processing technology can be more cost-effective than the semiconductor-on-insulator (SOI) technology used in many existing systems. However, manufacturing a power amplifier using conventional CMOS processing can be challenging. Some designs provide poor power amplifier linearity and otherwise undesirable performance at high power levels, for example. Some CMOS power amplifiers described herein incorporate a distributed active transformer (DAT) architecture, which addresses some of these challenges, providing relatively good performance and reduced costs, as compared to power amplifiers built using SOI technology, for example. For instance, DAT or other transformer-based power amplifiers can be built using bulk CMOS processing incorporating conventional substrates, e.g., instead of using SOI substrates and processing.

DAT power amplifiers can generally include a primary winding of an active transformer having a plurality of power amplifiers interconnected in a generally circular, rectangular, or other appropriate geometry. A secondary winding which can generally match the geometry of the primary winding can serve to efficiently combine the power of the individual power amplifiers. Examples of DAT transformers can be found in U.S. Pat. No. 6,737,948 ("the '948 patent"), which issued on May 18, 2004 and is titled "Distributed Circular Geometry Power Amplifier Architecture". Additional examples of DAT transformers including DAT transformers having a secondary winding disposed between two primary windings can be found in U.S. Pat. No. 7,095,283 ("the '283 patent"), which issued on Aug. 22, 2006 and is titled "Supply Circuit for Power Amplifier Drivers". The '948 and '283 patents are hereby incorporated by reference herein, and form a part of the present disclosure. In particular, the power amplifiers described in the '948 and '283 patents are compatible with and/or are components of embodiments described herein.

Traditional power amplifiers and transmit/receive switches in RF front-ends are typically implemented on separate dies. As an example, power amplifiers are often implemented with hetero-junction bipolar transistors (HBTs) on a Gallium Arsenide (GaAs) die while transmit/receive switches are implemented on a separate die implementing pseudomorphic high-electron mobility transfer (pHEMT) semiconductor technology.

Certain aspects of the present disclosure achieve higher levels of integration in RF front ends through the integration of the power amplifier and the transmit/receive switch onto a single die. For instance, according to certain embodiments, a transmit/receive switch and a DAT power amplifier are integrated onto a single CMOS die (e.g., a CMOS die built using conventional silicon substrate processing). In certain embodiments a single CMOS die includes a tuned DAT-based power amplifier with a transmit/receive switch placed on a ground or receive side of a secondary winding of the DAT. In the transmit mode, the switch is active. Because it is located on the ground or receive side of the transformer, the voltage swing across the switch can be kept small and reliability issues at high voltage as well as harmonic generation concerns can be reduced. In receive mode, the switch is deactivated, and the secondary winding of the DAT can provide a low loss path to the receiver. The switch can be implemented through a single CMOS transistor (e.g., a single NMOS transistor), where a gate voltage controls whether the device is in transmit or receive mode, although more transistors could be used in other embodiments.

Where the frequency separation between the transmit and receive band is relatively small, it can be difficult to maintain isolation between the transmit and receive bands. According to certain embodiments, the transformer-based matching network of the DAT can be tuned based on whether the amplifier is in transmit or receive mode. For instance, the DAT can include a de-tuning circuit or function which in the receive mode reduces the coupling coefficient of the transformer so that the secondary of the transformer appears primarily as an inductance, reducing signal loss to the primary through coupling. In one embodiment, the system adjusts the biasing levels of the transformer to implement the detuning function.

When the RF front-end is transmitting, relatively high transmit power can leak to the receive ports, which can damage componentry including surface acoustic wave (SAW) filters and low noise amplifiers (LNAs). In order to address such challenges certain other embodiments improve transmit/receive isolation through the incorporation of an on-die compensation circuit which can include a capacitance. The compensation circuit helps to maintain power incident at the receive ports to acceptable power levels (e.g., below between +10 to +13 Decibel-milliwatts [dbm] when the power amplifier is transmitting +35 dbm), thereby avoiding or minimizing risk of damage to front-end componentry. For instance, a compensation capacitor can be placed in series in the receive path, off of the secondary winding of the DAT, to reduce swing on the receive port(s) by canceling or reducing bond-wire reactance. The capacitor can be placed in series with an integrated transmit/receive switch that is integrated with the power amplifier on a CMOS die, for example.

FIG. 1 is a schematic block diagram of an example wireless or mobile device 11. The example wireless device 11 depicted in FIG. 1 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 megahertz (MHz) (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more radio frequency spectrum bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver 13, an antenna 14, power amplifiers 17, which can be CMOS DAT power amplifiers as will be described herein, a control component 18, a computer readable medium 19, a processor 20, a battery 21, and an envelope tracker 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 1 as the transceiver 13. For example, a single component can be configured to provide both transmitting and receiving functionalities. In another example, transmitting and receiving functionalities can be provided by separate components. For instance, one or more low noise amplifiers (LNAs) can be included in the RX path(s) between the switches 12 and the transceiver 13, and can be configured to amplify and otherwise condition the signal(s) received from the switches 12.

Similarly, it will be understood that various antenna functionalities associated with the transmission and receiving of RF signals can be achieved by one or more components that are collectively represented in FIG. 1 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 1, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 1 illustrates a configuration using two transmission paths 15 and two power amplifiers 17, the wireless device 11 can be adapted to include more or fewer transmission paths 15 and/or more or fewer power amplifiers 17.

In FIG. 1, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 1 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can include a number of switches and associated componentry configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 1 shows that in certain embodiments, a control component 18 can be provided for controlling various control functionalities associated with operations of the switches 12, the power amplifiers 17, the envelope tracker 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner.

The illustrated wireless device 11 also includes an envelope tracker 30, although other types of power controllers can be used in other embodiments, which can be used to provide power amplifier supply voltages to one or more of the power amplifiers 17. For example, the envelope tracker 30 can be configured to change the supply voltages provided to the power amplifiers 17 based upon an envelope of the RF signal to be amplified. In the illustrated implementation, the envelope signal is provided to the envelope tracker 30 from the transceiver 13. However, other implementations are possible, including, for example, configurations in which the envelope signal is provided to the envelope tracker 30 from a baseband processor or a power management integrated circuit (PMIC). Furthermore, in certain implementations, the envelope signal can be generated from the RF signal by detecting the RF signal's envelope using any suitable envelope detector.

The envelope tracker 30 can be electrically connected to the battery 21, which can be any suitable battery for use in the wireless device 11, including, for example, a lithium-ion battery. As will be described in detail further below, by controlling the voltage provided to one or more of the power amplifiers 17, the power consumed from the battery 21 can be reduced, thereby improving the battery life of the wireless device 11. In certain configurations, the power amplifiers 17 can be implemented using CMOS processing, which can lower cost and/or enhance integration. However, other configurations of the power amplifiers 17 are possible. For example, the power amplifiers 17 can be implemented using III-V semiconductor processing, such as Gallium Arsenide (GaAs) processing.

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which carriers within the same operating frequency band are aggregated. Carrier aggregation can also be non-contiguous, and can include carriers separated in frequency within a common band or in different bands.

Figure 2:
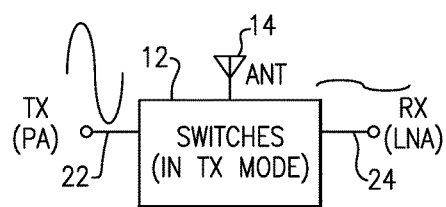
FIG. 2 is a schematic diagram of a transmit/receive switch that can be included in the wireless device of FIG. 1, and that can be integrated together on the same die as one or more power amplifiers.

FIG. 2 illustrates a simplified diagram of the switches block 12 and the antenna 14. As represented by the large and small waveforms, when the wireless device 11 is in a transmit mode, the switches 12 direct a transmit signal received on a transmit port 22 of the switches block from the power amplifier 17 to the antenna 14 for wireless transmission, while it is desirable to block all or substantially all of the transmit signal from leaking into the receive path. While not shown, in a receive mode, the switches 12 are configured to pass a signal received from the antenna to a receive port 24 of the switches block 12, for eventual delivery low noise amplifier (LNA) or other appropriate component in the receive path.

In some existing systems, the switching function is implemented by an SOI transistor network, such as a silicon-on-insulator transistor network. However, because to the large voltage swings of the signal provided by the power amplifiers 17, a relatively large number of transistors are often connected in series to avoid breakdown issues. For instance, in such systems the switches are often implemented using a number of series-connected transistors implemented in an SOI die that is separate from a die that includes the power amplifiers 17. This can increase costs and series connected transistors can increase series resistance losses and capacitive loss to the substrate.

Figure 3:
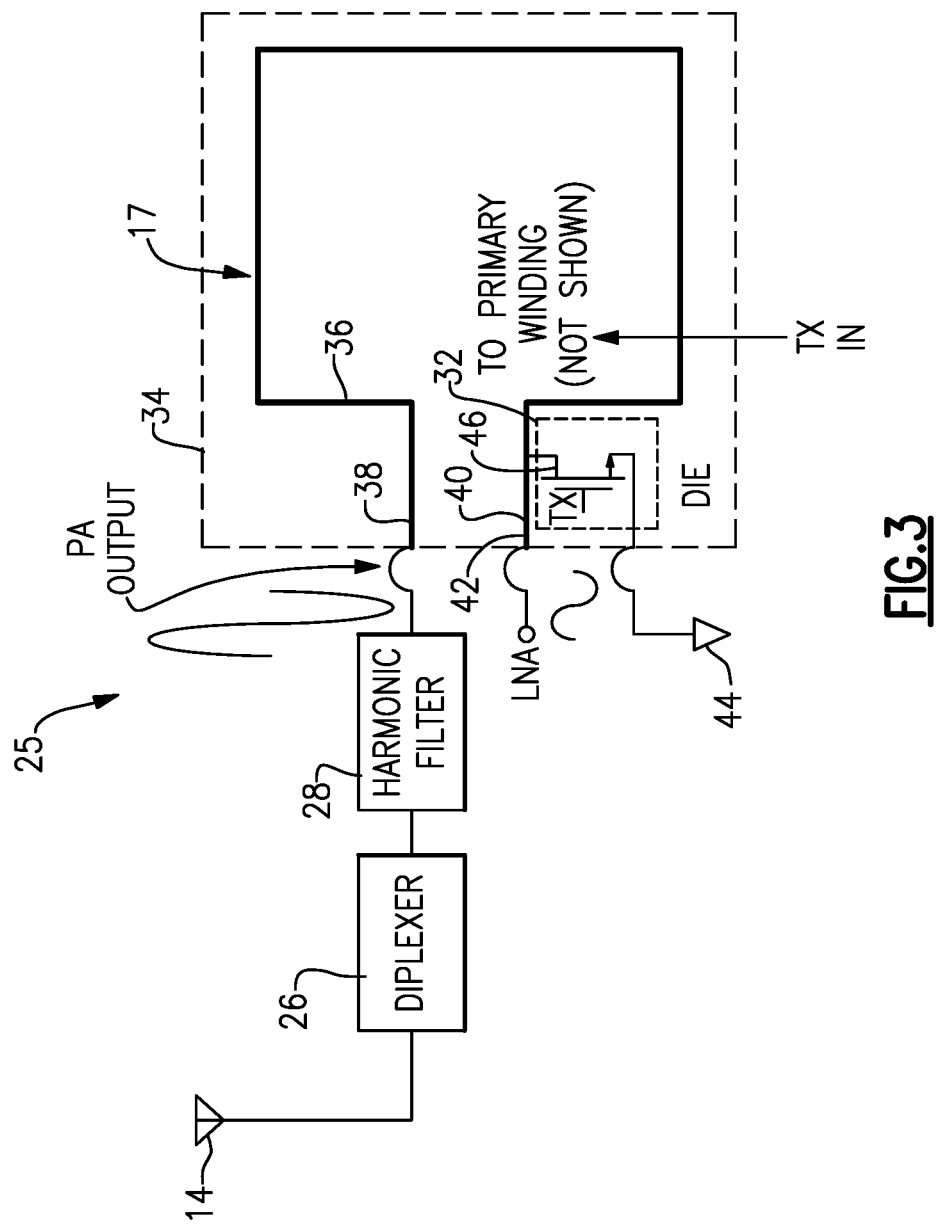
FIG. 3 is a schematic diagram of a portion of a wireless device including a distributed active transformer (DAT) power amplifier integrated onto a single die with a transmit/receive switch.

In order to address these issues, certain embodiments described herein by connect a transmit/receive switch to a secondary winding of a DAT-based power amplifier 17. FIG. 3 depicts a portion 25 of a wireless device showing an antenna 14, diplexer 26, harmonic filter 28, DAT-based power amplifier 17, and transmit/receive switch 32. As shown, the power amplifier 17 and transmit/receive switch 32 are integrated together on a single die 34, which can be a CMOS die, for example. While shown as a single switch for the purposes of illustration, the transmit/receive switch 32 can form some or all of the switches in the switches block 12 of the wireless device 11 of FIG. 1.

Although shown for the purposes of simplicity as having a single input and output port, the diplexer 26 can include multiple output ports connected to the harmonic filter 28 each dedicated to a particular frequency band. In a receive mode, the diplexer 26 can be configured to receive a signal from the antenna 14, extract frequency bands from the signal and provide on the appropriate output port. For instance, the diplexer 26 can include a first filter configured to pass a first frequency band of the receive signal to a first output port and a second filter configured to pass a second frequency band of the receive signal to a second output port. In a transmit mode, the diplexer 26 can be configured to pass a transmit signal received from an active transmit frequency band and output the signal to the antenna 14.

The harmonic filter 28 can be configured to suppress undesired harmonic in the transmit signal, depending on whether the device 11 is in a transmit or receive mode.

The power amplifier 17 in the illustrated embodiment is a DAT-based power amplifier. The power amplifier 17 includes a primary winding (not shown) and a secondary winding 36 of a transformer. As shown, the harmonic filter 28 is coupled to an antenna side or antenna end 38 of the secondary winding 36 of the DAT-based power amplifier 17, which forms an output of the power amplifier 17. For instance, the harmonic filter 28 may connect to the antenna side 38 of the secondary winding 36 through a bond-wire of the die 34.

As shown, when the device 11 is in transmit mode, a transmit input signal (TX IN) is provided to the primary winding of the power amplifier 17. The power amplifier 17 amplifies the input signal via an inductive transformer function and outputs an amplified version of the transmit signal on the antenna side 38 of the secondary winding 36. The transmit signal is passed to the harmonic filter 28, for eventual transmission via the antenna 14. As represented by the depiction of the relatively large wave form, relatively large voltage swings can be present on the output of the power amplifier 17 when the device 11 is in transmit mode.

As shown, a receive side or receive end of the secondary winding 36 couples to a receive port of the die 34. When the device 11 is in receive mode, signals received via the antenna 14 are processed by the diplexer 26 and harmonic filter 28, and communicated from the antenna side 38 of the secondary winding 36 to the receive side 40 of the secondary winding 36. The signal is transmitted off of the die 34 via a receive port 42, such as to an LNA and then to the transceiver 13 for subsequent processing.

The die 34 includes the transmit/receive switch 32 between the receive side 40 of the secondary winding 36 of the power amplifier 17 and reference voltage or ground 44. The transmit/receive switch 32 is formed by a single transistor 46, which in the illustrated embodiment is an nMOS field effect transistor (FET). However, more transistors and/or transistor(s) of different varieties can be used. In transmit mode, a voltage signal above a threshold voltage of the transistor 46 is applied to the gate of the transistor 46, thereby placing the transistor 46 in an 'on' state. This creates a low impedance path from the receive side 40 of the secondary winding 36 to ground 44. As a result there is relatively little signal swing seen by the receive port 42 of the die 34 and subsequent components in the receive path such as the LNA, as illustrated by the graphical depiction of a relatively small waveform at the receive port 42. In this manner, the switch 32 isolates and protects the LNA and other components in the receive path from damage when the device 11 is transmitting. In receive mode, on the other hand, a voltage signal below threshold of the transistor 46 is applied to the gate of the transistor 46, and the transistor 46 is in an 'off' state, creating high impedance path from the secondary winding 36 to ground, and thus allowing low loss transmission of the receive signal via the receive port 42.

Connecting the transmit/receive switch 32 to the receive side 40 of the secondary winding 36 of the power amplifier 17 in the illustrated manner enables integration of the transmit/receive switch 32 with the power amplifier 17 on a single CMOS die 34. The switch provides sufficient isolation between the transmit and receive paths, protecting downstream componentry in the receive path such as an LNA.

Figure 4:
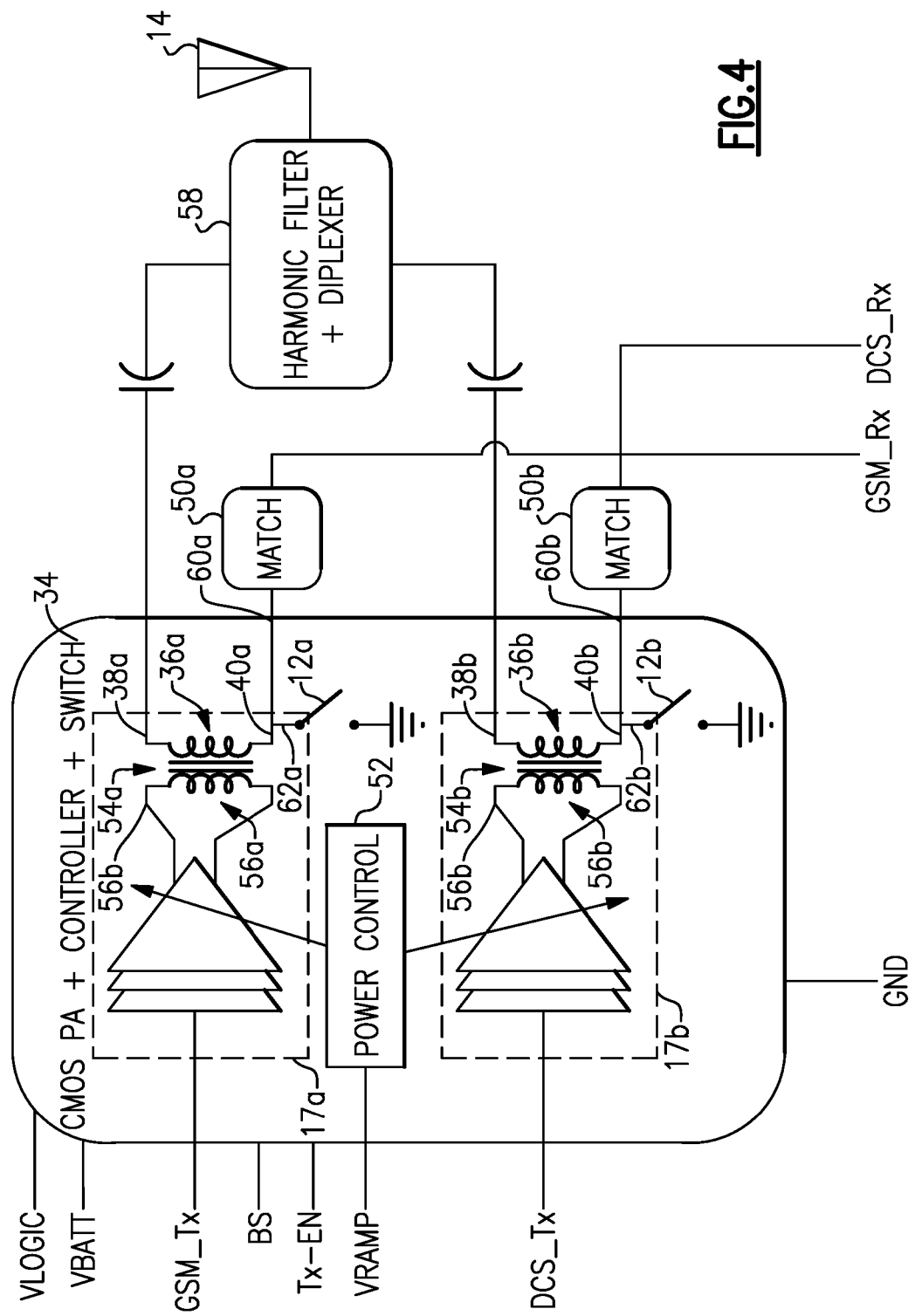
FIG. 4 is a schematic diagram of an embodiment of a portion of a wireless device having transformer-based power amplifiers integrated together with transmit/receive switches on a complementary metal oxide semiconductor (CMOS) die.

FIG. 4 is a schematic diagram of an embodiment of a portion of a wireless device having transformer-based power amplifiers integrated together with transmit/receive switches on a single semiconductor die 34, which is a CMOS die in the illustrated embodiment.

The wireless device can support multiple frequency bands, and includes separate paths each including a set of corresponding power amplifiers and transmit/receive switches.

For instance, in the illustrated embodiment, a first path supports a Global System for Mobile Communications (GSM) band, and includes corresponding power amplifier(s) 17a, transmit/receive switch(es) 12a, and matching circuitry 50a. The first path may use frequencies associated with any GSM band, including GSM-850, GSM-900, GSM-1900, or the like.

A second path supports a different frequency band than the first path, which is the Digital Cellular Service (DCS) band in the illustrated configuration, and includes corresponding power amplifier(s) 17b, transmit/receive switch (es) 12b, and matching circuitry 50b. The second path may use frequencies that correspond to the DCS band, which may be the same as the GSM-1800 band.

A power control block 52 resides on the die 34 and controls power delivery to the power amplifiers 17a, 17b. For instance, the power control block 52 in one embodiment implements an envelope tracking function, although other types of power control are possible, including average power tracking (APT), for example.

The power amplifiers 17a, 17b in the first and second paths receive and amplify corresponding transmit signals. In the illustrated embodiment, the power amplifiers 17a, 17a are DAT type power amplifiers, as represented by the transformers 54a, 54b. The amplified signal is transferred from the primary coil 56a, 56b of each power amplifier 17a, 17b to the secondary coil 36a, 36b of each power amplifier 17a, 17b. In particular, componentry 58 which can include one or more harmonic filters and/or diplexers is coupled to the antenna side 38a, 38b of the secondary coil 36a, 36b of each of power amplifier 17a, 17b. The componentry 58 is positioned between the power amplifiers 17a, 17b and an antenna 14, and when the wireless device is in transmit mode, the componentry 58 processes the transmit signal(s) and forwards the processed transmit signal(s) to the antenna for wireless transmission.

As shown, the transmit/receive switches 12a, 12b are positioned to be in a path to ground between nodes 62a, 62b. Each of the nodes 62a, 62b is electrically coupled to a receive side of the 40a, 40b of the secondary coil 36a, 36b of the corresponding power amplifier 17a, 17b, and a receive port 60a, 60b of the die 34.

In the transmit mode, the transmit/receive switches 12a, 12b for each path are closed, creating a low impedance path from the nodes 62a, 62b to ground, and thereby isolating the receive ports 60a, 60b from leakage of the relatively large transmit signal to the receive side 40a, 40b of the secondary coils 36a, 36b of the corresponding power amplifiers 17a, 17b.

On the other hand, in the receive mode, the transmit/receive switches 12a, 12b are opened, thereby creating a high impedance path from the nodes 62a, 62b to ground. In such cases, receive signals detected by the antenna 14 are forwarded to the componentry 58 for processing. The componentry 58 passes the processed receive signals to the secondary coils 36a, 36b of the respective power amplifiers 17a, 17b of each path. In particular, the receive signals pass from the antenna side 38a, 38b to the receive side 40a, 40b of the secondary winding 36a, 36b of the respective power amplifier 17a, 17b. Because, the receive switches 12a, 12b are opened, each receive signal passes to the receive port 60a, 60b of the corresponding path for transmission off of the die 34. The receive signals are then processed by the matching circuitry 50a, 50b before being forwarded to downstream componentry in the receive path such as an LNA and transceiver. The matching circuitry 50a, 50b can be configured to transform the impedances presented to the receive ports 60a, 60b into a desired impedance level, such as 50 ohms.

The control signal for turning the switches 12a, 12b on and off may be derived from the illustrated "Tx_EN" signal, which may be forwarded to the die 34 from an off-die processor of the wireless device, such as the processor 20 of the wireless device 11 shown in FIG. 1, or any other appropriate source.

Figure 5:
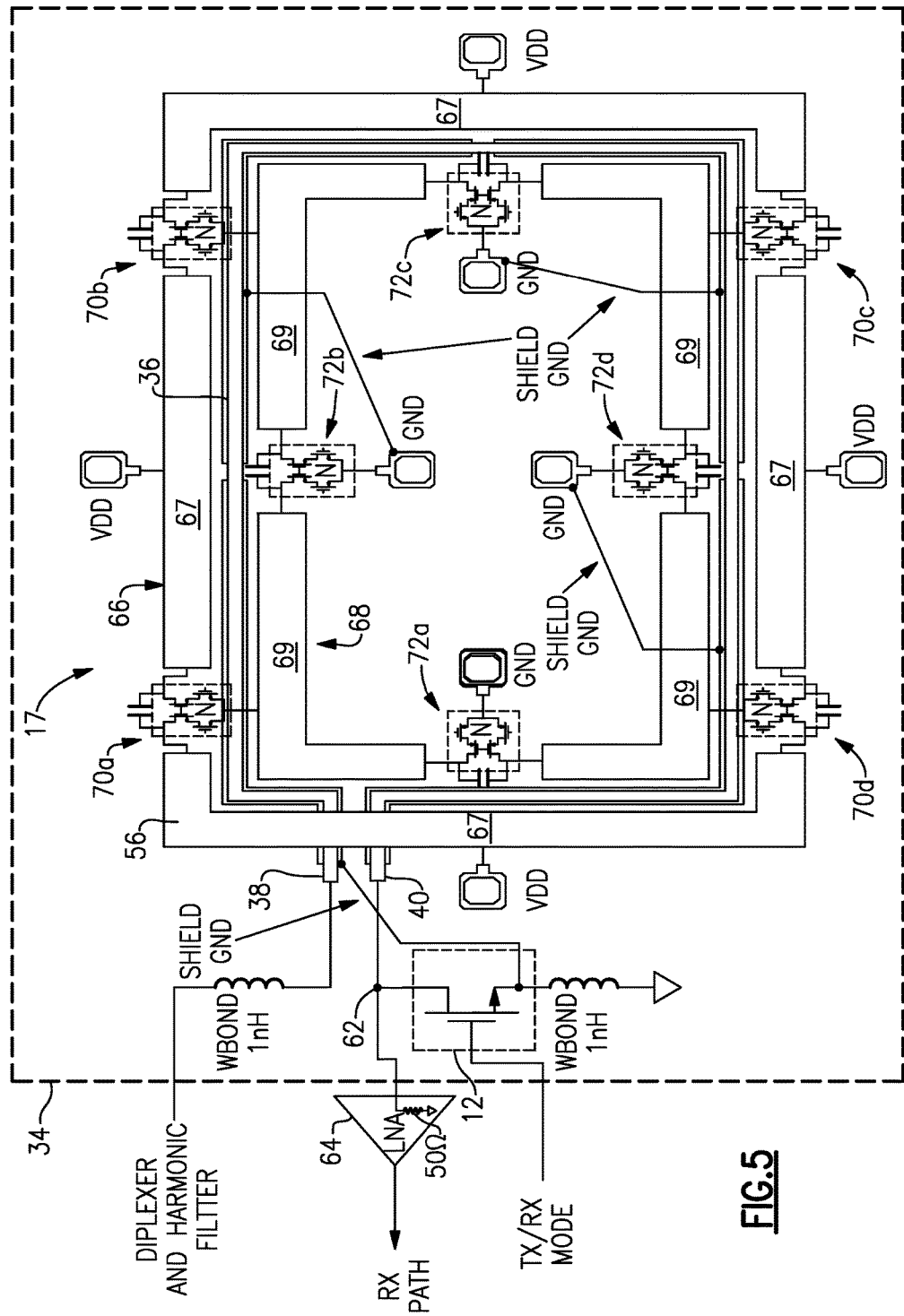
FIG. 5 is a schematic diagram showing another embodiment of a DAT power amplifier connected to a transmit/receive switch.

FIG. 5 is a schematic diagram showing another embodiment of a DAT power amplifier 17 connected to a transmit/receive switch 12, which may be integrated together on a die 34, which is a CMOS die in the illustrated embodiment. In the illustrated embodiment, the switch 12 is connected to a node 62, which is connected to receive side 40 of a secondary winding 36 of the power amplifier 17a and an input of an LNA 64. In particular, the switch 12 is positioned in a path between the node 62 and ground. An antenna side 38 of the secondary winding 36 is coupled to a diplexer and harmonic filter which are positioned between the antenna side 38 and an antenna (not shown). The power amplifier 17 also includes a primary winding 56. Although not shown in FIG. 5, a transmit input signal is connected to an input of the primary winding 56, which is amplified via the transform function implemented by the power amplifier 17. In a transmit mode, the amplified transmit signal is output to the antenna side 38 of the secondary winding 36, while the transmit receive switch is turned on, creating a low impedance path from the node 62 to ground, isolating the LNA 64 from transmit signal leakage onto the receive side 40 of the secondary winding 36.

As shown, the secondary coil 36 can be designed to generally match the geometry of the primary winding 56. The primary winding 56 may serve as an active winding, and includes an outer primary winding 66 formed from a plurality of inductive elements 67 and an inner primary winding 68 formed from a plurality of inductive elements 69. A plurality of amplifier stages 70a-70d are interposed between and connected to corresponding inductive elements 67 of the outer primary winding 66. A plurality of amplifier stages 72a-72d are interposed between and connected to corresponding inductive elements 69 of the inner primary winding 68. The magnetic coupling between the inductive elements 67 of the outer primary winding 66 and the inductive elements 69 of the inner primary winding 69 to the secondary winding 36 and the loop currents determine the amplified output of the secondary winding 36, thereby combining the outputs of the amplifier stages 70a-70d, 72a-72d.

While FIG. 5 shows one example of a power amplifier design, a wide variety of power amplifier designs are possible that are compatible with the embodiments described herein, including those described in the '948 and '283 patents.

Figure 6:
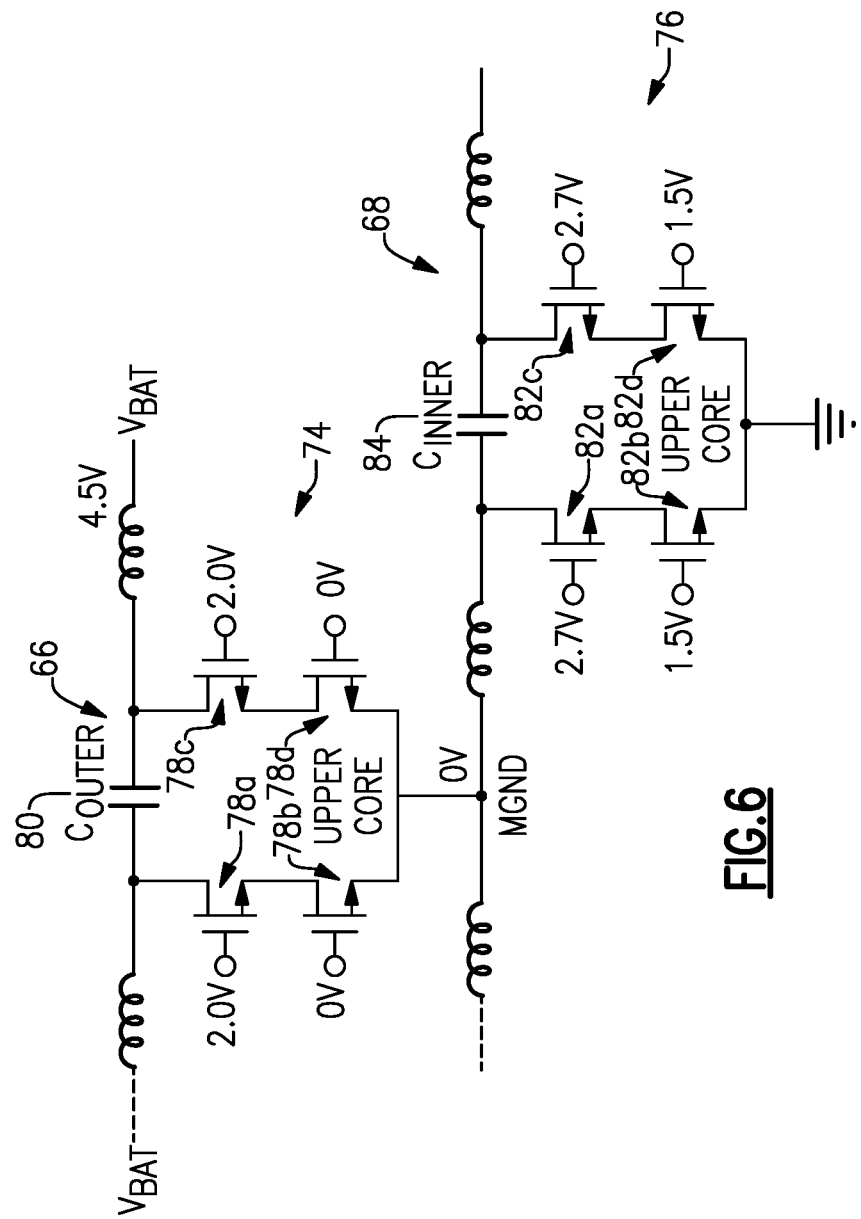
FIG. 6 is a schematic diagram illustrating an example biasing configuration for a DAT power amplifier.

FIG. 6 is a schematic diagram illustrating an example biasing configuration for a DAT power amplifier. An outer amplifying stage 74 is coupled to a power supply (V bat) via the outer primary winding 66. An inner amplifying stage 76 is coupled to the outer amplifying stage 74 via an inner primary winding 68.

In the illustrated embodiment, the outer amplifier stage 74 includes four field effect transistors 78a-78d. A first pair 78a, 78b of the four transistors are connected in a first cascode configuration and the second pair 78c, 78d of the two transistors are connected in a second cascode configuration. A first end of the first cascode configuration is connected to a first end of the second cascode configuration via a first tuning capacitance 80, while a second end of the first cascode configuration and a second end of the second cascode configuration share a common connection to the inner primary winding 68.

The inner amplifier stage 76 includes four field effect transistors 82a-82d. A first pair 82a, 82b of the four transistors are connected in a first cascode configuration and the second pair 82c, 82d of the two transistors are connected in a second cascode configuration. A first end of the first cascode configuration is connected to a first end of the second cascode configuration via a second tuning capacitance 84, while a second end of the first cascode configuration and a second end of the second cascode configuration are connected to ground.

While only a single outer amplifying stage 74 and inner amplifying stage 76 are shown for the purposes of illustration, additional amplifying stages having the same or similar configuration are included in the power amplifier, as indicated by the dashed lines. For instance, the amplifier stages 74, 76 may be amplifier stages of a power amplifier 17 similar to the one shown in FIG. 5.

Along these lines, a transmit receive switch may be connected to a receive side of a secondary winding (not shown) of a power amplifier including the outer and inner amplifying stages 74, 76 shown in FIG. 6 in a manner similar to the configuration shown in FIG. 5. In such cases, it can be important to limit the amount of power that is transferred between the primary winding 56 to the secondary winding 36 when the wireless device is in receive mode. For instance, a DAT power amplifier can exhibit a relatively broad-band match, where the frequency separation between the receive and transmit sub-bands is small. In receive mode, the inner and outer primary windings of the DAT may in some cases resonate with the secondary, leading to poor receive/transmit isolation and insertion loss.

In order to counteract such effects, certain configurations provide detuning of the DAT in receive mode using a control circuit that is disabled in receive mode. For instance, the circuit can control the DAT in order to detune the primary and secondary windings 36, 56 with respect to one another during receive mode, such that the primary and secondary windings 36, 56 are configured to have quite different center frequencies during receive mode. This is in contrast to transmit mode, where the primary and secondary windings 36, 56 are configured to have similar center frequencies, thereby improving the gain of the power amplifier.

FIG. 6 shows one exemplary biasing configuration that is implemented during receive mode to detune the primary and secondary windings with respect to one another. As shown, values of 2.0, 0, 2.0, and 0 volts are respectfully applied to the four transistors 78a, 78b, 78c, 78d of the outer amplifier stage 74. The four transistors of the illustrated embodiment are N-type metal-oxide semiconductor field-effect transistors (MOSFETs) having threshold voltages of around 0.4 volts, although different transistor types and/or threshold voltages are possible. As will be appreciated, similar values may be applied to additional amplifier stages associated with the outer winding 74 not explicitly shown in FIG. 6. Values of 2.7, 1.5, 2.7, and 1.5 volts are respectfully applied to the four transistors 82a, 82b, 82c, 82d of the inner amplifier stage 76. The four transistors of the illustrated embodiment are N-type metal-oxide semiconductor field-effect transistors (MOSFETs) having threshold voltages of around 0.4 volts, although different transistor types and/or threshold voltages are possible. As will be appreciated, similar values may be applied to additional amplifier stages associated with the inner winding 76 not explicitly shown in FIG. 6.

Adjusting the bias levels in the manner shown in FIG. 6 modifies the overall tuning capacitance of the outer and inner primary windings 74, 76, thereby providing the desired detuning with the secondary winding 36. For instance, according to one embodiment, the bias configuration shown in FIG. 6 results in the transistors 78a, 78b, 78c, 78d of the outer amplifier stage 74 being turned off, while the transistors 82a, 82b, 82c, 82d of the inner amplifier stage 76 are turned on. The resulting capacitances of the transistors 78a, 78b, 78c, 78d of the outer amplifier 74 in the off state are in parallel with the tuning capacitor 80 of the outer primary winding 66. On the other hand, the resistances of the transistors 82a, 82b, 82c, 82d of the inner amplifier stage 76 being in the on state acts to short out the tuning capacitor 84 of the inner primary winding 68. The bias configuration shown in FIG. 6 can be used in a receive mode, for example, such as where a controller or control circuit of a wireless device 11 including the power amplifier generates the bias control signals in response to the device 11 being placed in a receive mode. By biasing the outer and inner amplifier stages 74, 76 in the manner shown in FIG. 6, the primary and secondary windings 36, 56 are detuned with respect to one another and have divergent center frequencies. In particular, the illustrated biasing configuration results in a reduction in the coupling coefficient of the transformer so that the secondary winding 36 of the transformer appears primarily as an inductance, reducing signal loss to the primary winding 56 through coupling.

According to some embodiments, switches could be placed across or in series with the inner and outer tuning capacitors 80, 84 to provide the desired detuning function. However, such switches may enter breakdown during transmit due to the large swings on the primary windings 74, 76. Thus, modifying the tuning capacitance by adjusting the gates of the transistors 78a-78d, 82a-82d in the DAT amplifier stages 74, 76 advantageously provides the desired detuning while preventing breakdown or circuit damage.

While not shown in FIG. 6, in a transmit mode, the voltages applied to the transistors would be different, and in the transmit mode the center frequencies of the primary and secondary windings can be significantly more aligned than in the receive mode, such as in a receive mode where the biasing is done in the manner set forth in FIG. 6.

Figure 7:
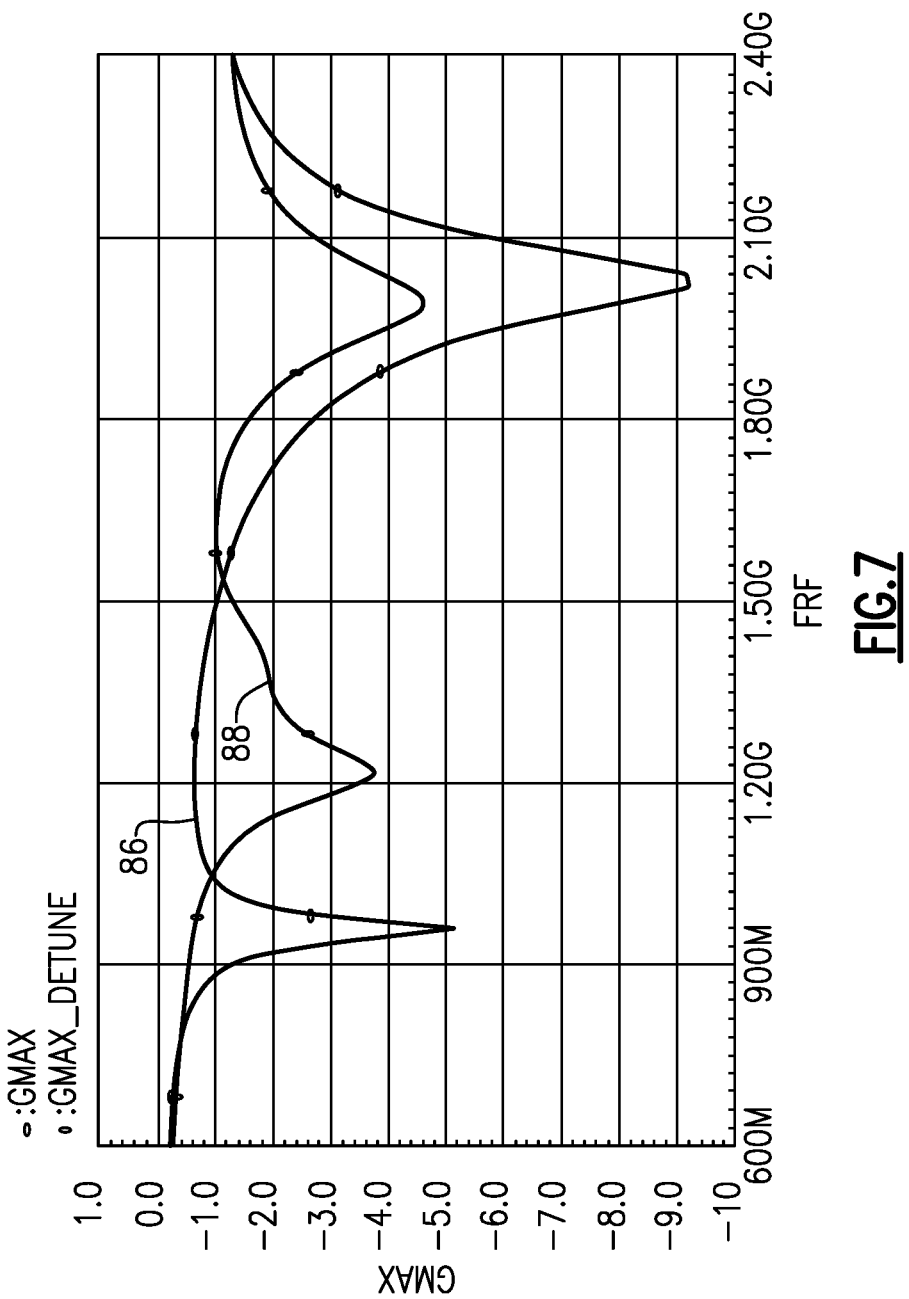
FIG. 7 is a graph that shows the detuning of the primary and secondary windings achieved by the biasing configuration shown in FIG. 6.

FIG. 7 is a graph that shows the detuning of the primary and secondary windings 36, 56 achieved by the biasing configuration shown in FIG. 6. In particular, plots 86, 88 show output characteristics of the power amplifier 17 without the biasing/detuning configuration shown in FIG. 6 (plot 86) and with the biasing/detuning configuration shown in FIG. 6 (plot 88). As shown, without the biasing/detuning configuration (plot 86), there is a sharp notch in the power amplifier output at about 1 GHz, which can result in significant receive loss at about 850 MHz. With the biasing/detuning configuration of FIG. 6 (plot 88), on the other hand, a notch appears at a higher frequency of about 1.2 GHz, resulting in receive loss at about 850 MHz being improved by more than about 0.5 dB as compared to without the biasing/detuning configuration (plot 88). The output characteristic can be a maximum gain (GMAX) of the power amplifier, for example.

Referring again to FIG. 3 for the purposes of illustration, there can be large voltage swings at the receive port 42 due to the relatively large transmit signal swings present on the primary winding and transferred to the secondary winding 36 when the power amplifier 17 is operating in transmit mode. In particular, a bond wire between the switch 32 and ground 44 acts as an inductor at high frequencies, creating a high impedance. The combination of this high impedance and the high current levels present during transmit mode result in high voltage level, which can lead to undesirable amounts of leakage power in some cases.

FIGS. 8A-8B are schematic diagrams showing examples of power amplifier configurations including a compensation circuit 90 configured to reduce leakage power. Referring first to FIG. 8A, the configuration includes a DAT power amplifier 17 including an amplifier stage 70 associated with and connected to an outer primary winding 66, which is in turn coupled to a power source (VBAT). The power amplifier 17 further includes an amplifier stage 72 associated with and connected to an inner primary winding 68, which is in turn coupled to ground via a first bond wire 92. As shown, the inner primary winding 72 is also connected to the amplifier stage 70 associated with the outer primary winding 66. An antenna side 38 of a secondary winding 36 of the power amplifier 17 is connected via a second bond wire 94 to a first port 96, which may be a port of a die 34, which is a CMOS die in the illustrated embodiment, on which the componentry shown in FIG. 8A resides. The first port 96 may be connected to an antenna, for example, via intermediate componentry (not shown) which can include harmonic filters and/or diplexers as described herein. A receive side 40 of the secondary winding 36 is coupled to a second port 98 via a third bond wire 100. The second port may be a receive port of a CMOS die, for example, and may be connected to an LNA or other componentry in the receive path of the wireless device. The receive side 40 of the secondary winding 36 may also be coupled to a transmit/receive switch 12, which is connected in a path to ground along with a fourth bond wire 102 and a compensation circuit 90. The wireless device may turn the switch 12 on in a transmit mode and off in a receive mode in order to isolate the receive port 98 from the transmit path in a receive mode, as described herein.

The compensation circuit 90 includes a single capacitor in series with the switch 12 and bond wire 102 in the illustrated embodiment. As indicated previously, the compensation circuit 90 serves to reduce leakage power. Specifically, inclusion of the compensation circuit 90 acts to reduce impedance in the path between the switch 12 and ground during transmit mode. For instance, the capacitor 104 cancels the reactance of the bond wire 102, reducing voltage swing on the receive port 98.

During receive mode, it can be desirable for the wireless device to maintain similar behavior in the presence of the compensation circuit 90 as for configurations that do not include the compensation circuit 90. Thus, the compensation capacitor 104 can be selected to have a capacitance that is greater than or equal to the effective capacitance of the switch 12 when the switch 12 is in an off state during receive mode. In this manner, the compensation circuit 90 can have minimal impact on the receive signal that is output on the receive port 98 in receive mode.

In the illustrated embodiment, the capacitor has a capacitance of about 14 picofarads (PF) and the inductance of the bond wire during transmit mode is about 0.5 nanohenry for transmit frequencies of 850 MHz. In other embodiments, the compensation circuit 90 can have a different capacitance and can include additional capacitors and/or different componentry.

While only a single outer winding amplifier stage 70 and a single inner winding amplifier stage 72 are shown in FIG. 8A, it will be appreciated that additional amplifier stages may be present. As one example, the power amplifier 17 shown in FIG. 8A may form a portion of the power amplifier 17 shown in FIG. 5, and there may be a total of four additional outer winding amplifier stages 70 and four additional outer winding amplifier stages 72 arranged in the manner shown in FIG. 5.

FIG. 8B shows an alternative configuration where the order of the compensation circuit 90 and the bond wire 102 are switched in the path from the switch 12 to ground. For instance, in such a case, the compensation circuit 90 may be implemented on the same die as the power amplifier 17 and/or transmit/receive switch 17, thereby reducing costs.

Figure 9:
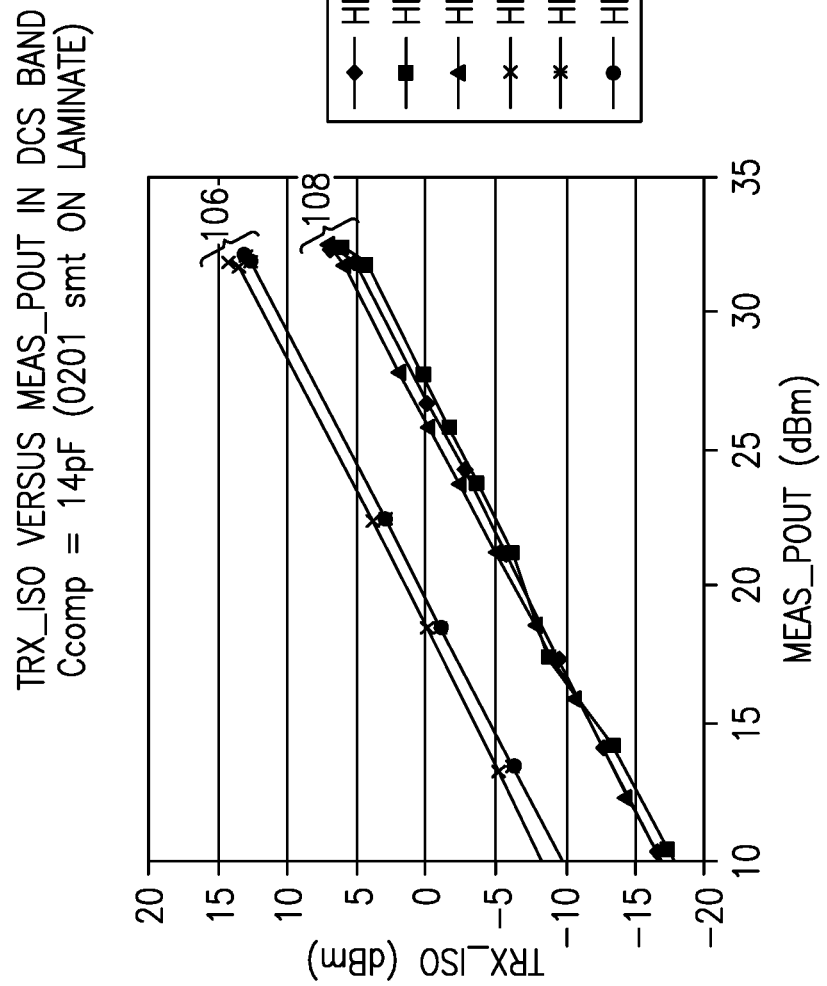
FIG. 9 is a graph showing transmit/receive isolation of a wireless device including the power amplifier configuration of FIGS. 8A-8B, with and without the compensation circuit.

FIG. 9 is a graph depicting transmit/receive isolation for configurations with and without a compensation circuit 90. For instance, the group of three plots 106 shows transmit/receive isolation for a wireless device similar to the FIGS. 8A-8B that does not include a compensation circuit 90, for frequencies of 1710, 1750, and 1785 MHz. Specifically, referring to FIG. 8A, the plots 106 shows the relative amount of transmit power leaking to the receive port 98 in Decibel-milliwatts (dBm) for different transmit powers measured on the first port 96. On the other hand, the group of three plots 108 shows transmit/receive isolation for a wireless device similar to the FIGS. 8A-8B with a compensation circuit 90 including a single 14 pF capacitor 104, also for frequencies of 1710, 1750, and 1785 MHz. As shown, inclusion of the compensation circuit 90 improves by transmit receive isolation by greater than about 5 dBm.

Figure 10:
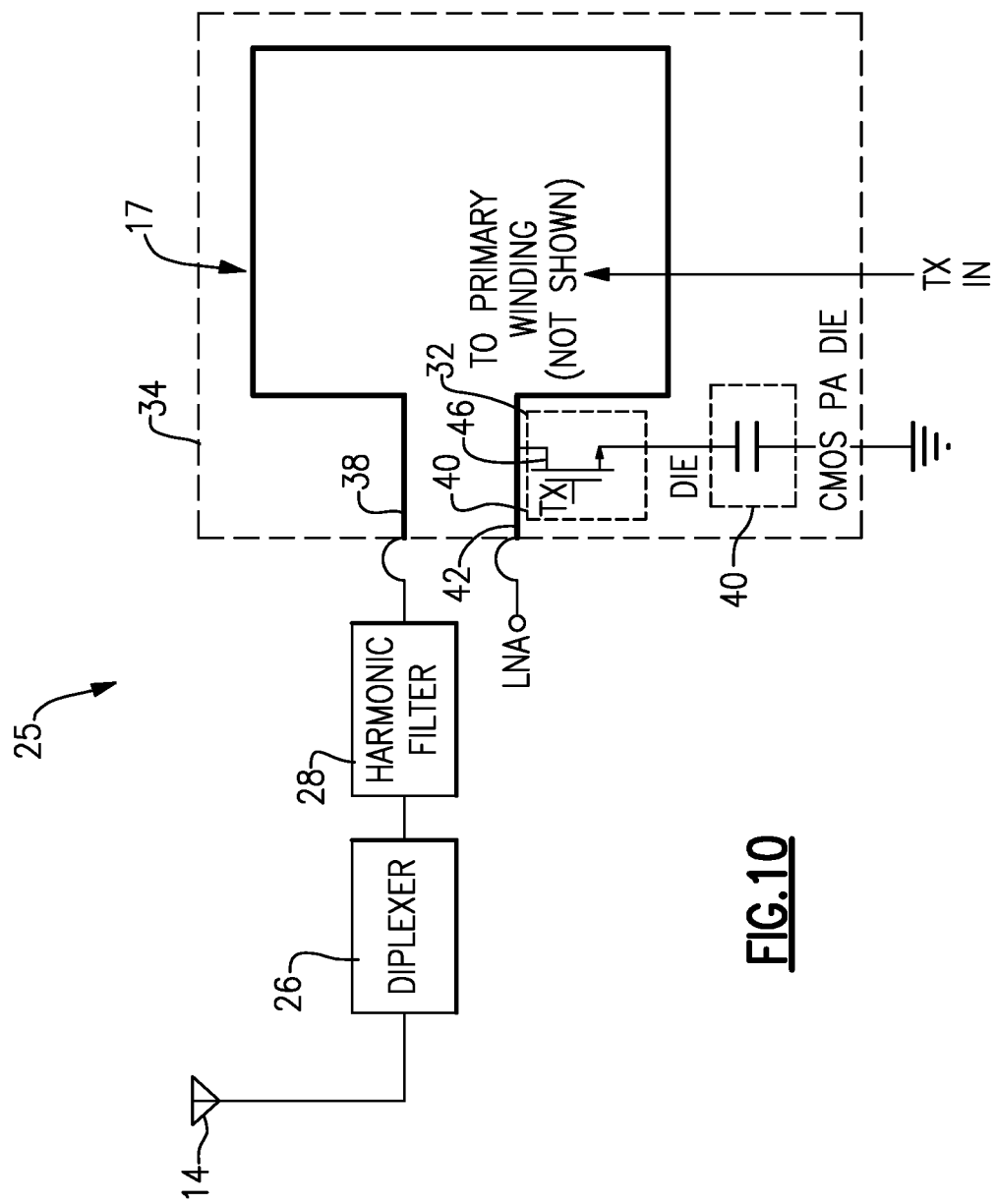
FIG. 10 is a schematic diagram of a portion of one embodiment of a wireless device including a compensation circuit.

FIG. 10 depicts a portion of a wireless device similar to that shown in FIG. 3, but with a compensation circuit 90 including a capacitor 104 included on the die 34 in the path between the switch 12 and ground.

For the purposes of illustration, many of the inventive apparatus and methods provided herein have been described in the context of power amplifiers, switches and other components built using CMOS processing, e.g., CMOS processing incorporating conventional silicon substrates (instead SOI substrates, for example). However, according to various embodiments, the apparatus and methods described herein can additionally be implemented using other, non-CMOS types of bulk silicon processing.

Applications

Some of the embodiments described above have provided examples in connection with wireless devices or mobile phones. However, the principles and advantages of the embodiments can be used for any other systems or apparatus that have needs for the embodiments described herein.

Such embodiments can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency device comprising:
an antenna;
a receive path configured to process radio frequency receive signals detected by the antenna;
a distributed active transformer-based power amplifier including a primary winding and a secondary winding and configured to output an amplified radio frequency transmit signal when the radio frequency device is in a radio frequency transmit mode;
a switch positioned between a node in the receive path and a reference voltage such that the switch creates a low impedance path between the node and the reference voltage when the switch is on in the radio frequency transmit mode and creates a high impedance path to the reference voltage when the switch is off in a radio frequency receive mode; and
a compensation circuit connected in series with the switch in a path extending from the switch to the reference voltage, the compensation circuit acting to limit a voltage swing present at the node in the receive path when the switch is on in the radio frequency transmit mode.

2. The radio frequency device of claim 1 wherein the compensation circuit includes a capacitor.

3. The radio frequency device of claim 1 wherein the compensation circuit counteracts a reactance of a bond wire residing in the path between the switch and the reference voltage.

4. The radio frequency device of claim 1 wherein the power amplifier, the switch, and the compensation circuit are integrated together on a semiconductor die.

5. The radio frequency device of claim 4 wherein the compensation circuit resides on the semiconductor die between a first terminal of the switch and a bond pad of the semiconductor die.

6. The radio frequency device of claim 5 wherein the node in the receive path is electrically coupled to a second terminal of the switch and to a receive port of the semiconductor die.

7. The radio frequency device of claim 6 wherein the compensation circuit improves isolation between the receive path and the radio frequency transmit signal when the radio frequency device is in the radio frequency transmit mode.

8. The radio frequency device of claim 4 wherein the geometry of the secondary winding generally matches the geometry of the primary winding.

9. The radio frequency device of claim 8 wherein the primary winding has an inner winding generally conforming to an interior boundary of the secondary winding and an outer winding generally conforming to an exterior boundary of the secondary winding.

10. The radio frequency device of claim 4 wherein the primary winding receives a set of bias signals having a first set of values in the radio frequency transmit mode to bias the primary winding in a first state and having a second set of values in the radio frequency receive mode to bias the primary winding in a second state in which the primary and secondary windings are detuned with respect to one another.

11. A semiconductor die comprising:
a distributed active transformer power amplifier including a primary winding and a secondary winding and configured to output a radio frequency transmit signal;
a receive path configured to communicate and process a radio frequency receive signal;
a switch positioned between a node in the receive path and a pad of the semiconductor die such that the switch creates a low impedance path between the node and the pad when the switch is on in a radio frequency transmit mode and creates a high impedance path to the pad when the switch is off in a radio frequency receive mode; and
a compensation circuit connected in series with the switch in a path extending from the switch to the pad, the compensation circuit acting to limit a voltage swing present at the node in the receive path when the switch is on in the radio frequency transmit mode.

12. The semiconductor die of claim 11 wherein the geometry of the secondary winding generally matches the geometry of the primary winding.

13. The semiconductor die of claim 12 wherein the primary winding has an inner winding generally conforming to an interior boundary of the secondary winding and an outer winding generally conforming to an exterior boundary of the secondary winding.

14. The semiconductor die of claim 11 wherein the compensation circuit includes a capacitor.

15. The semiconductor die of claim 11 wherein the compensation circuit counteracts a reactance of a bond wire residing in a path between the switch and the pad.

16. A method of operating a radio frequency device, the method comprising:
when the radio frequency device is in a radio frequency transmit mode,
providing a radio frequency transmit signal to a distributed active transformer-based power amplifier of the radio frequency device;
amplifying the radio frequency transmit signal with the power amplifier to provide an amplified version of the radio frequency transmit signal;
controlling a transmit/receive switch to create a low impedance path from a node in a receive path of the radio frequency device to a reference voltage; and
with a compensation circuit positioned between the switch and the reference voltage, limiting a voltage swing present at the node in the receive path due to leakage of the radio frequency transmit signal, wherein the power amplifier, the switch, and the compensation circuit are implemented together on a common semiconductor die.

17. The method of claim 16 wherein the compensation circuit includes a capacitor.

18. The method of claim 17 wherein the compensation circuit limits the voltage swing by counteracting a reactance of a wire in the path between the switch and the reference voltage.

* * * * *